(12) United States Patent
Davis et al.

(10) Patent No.: US 6,194,910 B1
(45) Date of Patent: Feb. 27, 2001

(54) RELAYLESS VOLTAGE MEASUREMENT IN AUTOMATIC TEST EQUIPMENT

(75) Inventors: Richard P. Davis, Beverly; Jiann-Neng Chen, Weston, both of MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/104,099

(22) Filed: Jun. 24, 1998

(51) Int. Cl.[7] ................................................. G01R 31/02
(52) U.S. Cl. ........................ 324/765; 324/73.1; 324/158.1
(58) Field of Search ................................. 324/765, 763, 324/764, 754, 158.1, 73.1; 371/20

(56) References Cited

U.S. PATENT DOCUMENTS

| | | | |
|---|---|---|---|
| 4,092,701 | 5/1978 | Bumgardner | 330/297 |
| 4,523,143 | 6/1985 | Dvorak | 324/133 |
| 4,524,331 | 6/1985 | Faith | 330/292 |
| 4,629,910 | 12/1986 | Early et al. | 307/317 |
| 4,646,299 * | 2/1987 | Schinabeck et al. | 371/20 |
| 5,036,218 | 7/1991 | Jaquette | 307/300 |
| 5,045,803 | 9/1991 | Perroud et al. | 330/51 |
| 5,070,297 * | 12/1991 | Kwon et al. | 324/754 |
| 5,083,095 | 1/1992 | Madaffari | 330/277 |
| 5,103,169 * | 4/1992 | Heaton et al. | 324/158.1 |
| 5,113,146 | 5/1992 | de Jager et al. | 330/252 |
| 5,153,510 | 10/1992 | Kominsky | 324/99 |
| 5,245,222 | 9/1993 | Carobolante | 307/254 |
| 5,313,114 | 5/1994 | Poletto et al. | 307/355 |
| 5,363,058 | 11/1994 | Sasaki | 330/136 |
| 5,512,853 | 4/1996 | Ueno et al. | 327/333 |
| 5,543,728 * | 8/1996 | Grace et al. | 324/763 |
| 5,554,951 | 9/1996 | Gough | 327/337 |
| 5,638,026 | 6/1997 | Hashimoto | 330/260 |

* cited by examiner

Primary Examiner—Safet Metjahic
Assistant Examiner—T. R. Sundaram
(74) Attorney, Agent, or Firm—Teradyne Legal Dept.

(57) ABSTRACT

A tester that is capable of performing voltage measurements on electronic circuits is disclosed. The tester includes voltage measurement circuitry with an input, a plurality of gain stages, and switching circuitry coupled between the input and the gain stages. The switching circuitry includes a plurality of diodes, and a portion of the gain stages includes current-to-voltage converters. Each diode is coupled to a respective current-to-voltage converter. By applying different bias voltages to the respective current-to-voltage converters, the diodes can be made to conduct current for different ranges of voltages at the input. The output of each current-to-voltage converter is proportional to a respective voltage range.

12 Claims, 3 Drawing Sheets

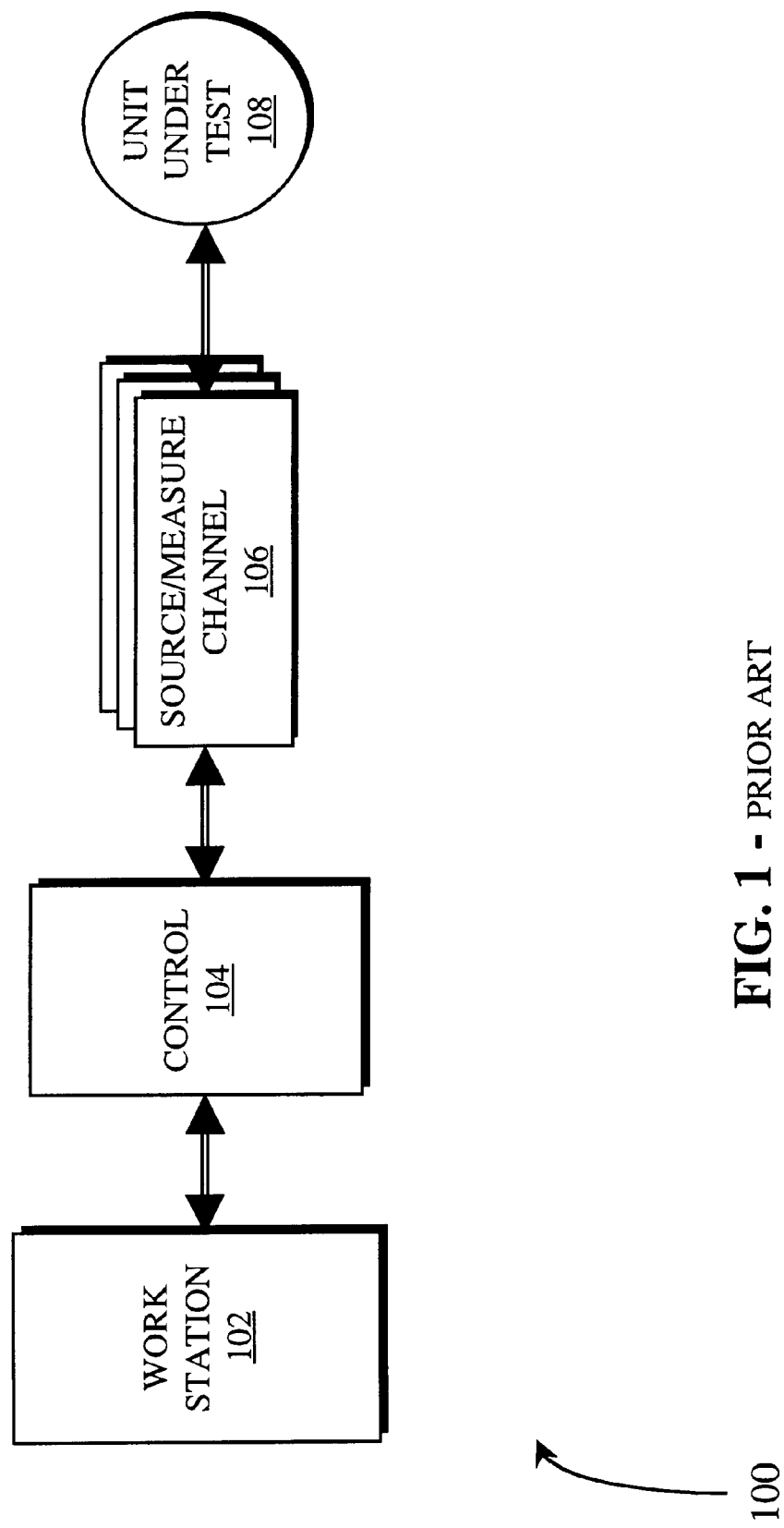
FIG. 1 - PRIOR ART

RELAYLESS VOLTAGE MEASUREMENT IN AUTOMATIC TEST EQUIPMENT

This invention relates generally to automatic test equipment, and more specifically to automatic test equipment capable of performing voltage measurements on electronic circuitry.

Automatic test equipment (also known as a "tester") is commonly used to test semiconductor devices and printed circuit board assemblies to determine whether the devices and assemblies contain defects. In a typical test configuration, testers are programmed to apply test signals to an electronic unit under test (UUT), detect output signals produced by the UUT in response to the test signals, and then compare the detected signals with expected values. Testers are also typically programmed to measure various levels produced by the UUT or other parameters related to the UUT and then compare these measured values with other expected values.

FIG. 1 shows a partial block diagram of a conventional tester 100 used to test a UUT 108. The tester 100 includes computerized control circuitry 104 coupled to a workstation 102, which is typically used to develop test programs and enter commands for controlling the tester 100. Further, the test programs are typically loaded into a memory (not shown) included in the control circuitry 104, thereby programming the control circuitry 104 to perform various test and analysis operations. For example, the control circuitry 104 may be programmed to control a plurality of source/measurement channels such as a source/measurement channel 106, which generates and measures signals and/or levels during testing of the UUT 108.

In particular, the control circuitry 104 may be programmed to control the channel 106 for performing voltage measurements on the UUT 108. Such voltage measurements frequently cover a range of analog voltage levels. Accordingly, the channel 106 typically includes circuitry (not shown) for measuring a plurality of voltage ranges.

For example, a portion of the voltage measurement circuitry in the channel 106 may be optimized for measuring a low range of voltage levels, while another portion may be optimized for measuring a high range of voltage levels. In some applications, the low voltage range corresponds to levels that fall within the supply rails of the measurement circuitry, and the high voltage range corresponds to levels that might exceed the supply rails of the measurement circuitry.

Further, the voltage measurement circuitry in the channel 106 typically includes some form of switching circuitry to select between the plurality of voltage ranges. Discrete relays are often used to perform this switching function.

Although the tester 100 has been successfully used to perform voltage measurements on semiconductor devices and printed circuit board assemblies, we have recognized some drawbacks. For example, in a typical tester configuration, the front-end of the circuitry for measuring low voltage ranges includes an active buffer, which provides a high impedance interface between the measurement circuitry and the unit under test. This generally ensures good DC performance in the low voltage range.

In contrast, the front-end of the circuitry for measuring high voltage ranges typically includes voltage divider circuitry. This is because levels in the high voltage range might exceed the supply rails of the measurement circuitry and therefore must be reduced by proportional amounts to ensure accurate voltage measurements. However, the voltage divider circuitry generally provides a low impedance interface between the measurement circuitry and the unit under test, thereby compromising DC performance in the high voltage range.

In addition, the discrete relays used for selecting between the voltage ranges are known to be relatively unreliable and costly. Such relays are also known to introduce insertion loss errors that can lead to signal degradation.

Further, discrete relays are generally incompatible with integrated circuit design techniques. Such design techniques are particularly important for testers because in order to test high performance devices and boards, it is frequently necessary to place source and measurement channel circuitry as close as possible to the unit under test. This generally reduces timing errors that can result from impedance mismatches between the unit under test and the signal path to the channel circuitry. The miniaturization that can be achieved using integrated circuit design techniques makes it possible to place more channel circuitry closer to the unit under test. However, channel circuitry that includes discrete relays cannot take full advantage of this miniaturization.

In an alternative tester configuration, the voltage measurement circuitry may include an active buffer with supply inputs that are "boot-strapped" to the input voltage. This ensures that the input voltage level never exceeds the supply rails of the measurement circuitry, thereby reducing the need for selecting between voltage ranges. Consequently, the use of unreliable and costly relays can be avoided. Further, this approach provides a relatively high impedance interface between the measurement circuitry and the unit under test.

However, performing voltage measurement using this alternative configuration also has drawbacks. In particular, because this approach includes buffer circuitry with supply inputs that follow the input voltage, it tends to require excessive amounts of power when performing high voltage measurements. Further, high voltage levels are typically applied to the inputs of the buffer circuitry during the high voltage measurements. These considerations generally make the "boot-strapped" configuration incompatible with integrated circuit design techniques. In addition, because this approach generally does not require separate circuitry for measuring different voltage ranges, performance is usually not optimized for low and high voltage measurements.

It would therefore be desirable to have a tester that can successfully measure a wide range of voltage levels. Such a tester would have voltage measurement circuitry that is highly reliable, low cost, and compatible with integrated circuit design techniques.

SUMMARY OF THE INVENTION

With the foregoing background in mind, it is an object of the invention to provide a tester that can perform voltage measurements on electronic circuitry.

Another object of the invention is to provide a tester that can perform a wide range of voltage measurements while satisfying the loading requirements of the electronic circuitry.

Still another object of the invention is to provide a tester with voltage measurement circuitry that can be implemented using integrated circuit design techniques.

The foregoing and other objects are achieved in a tester having measurement circuitry that includes a plurality of gain stages and a plurality of diodes for selecting among the gain stages.

In a preferred embodiment, the plurality of diodes is used to select among a plurality of current-to-voltage converters. Further, the plurality of current-to-voltage converters is connected to respective bias voltages, which are used to specify voltage ranges measured by the current-to-voltage converters.

In another embodiment, the measurement circuitry includes summing circuitry coupled to the gain stages for providing a level that is proportional to an input voltage level.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1 is a partial block diagram of a conventional tester;

DESCRIPTION OF THE PREFERRED EMBODIMENT

Figure 2A:
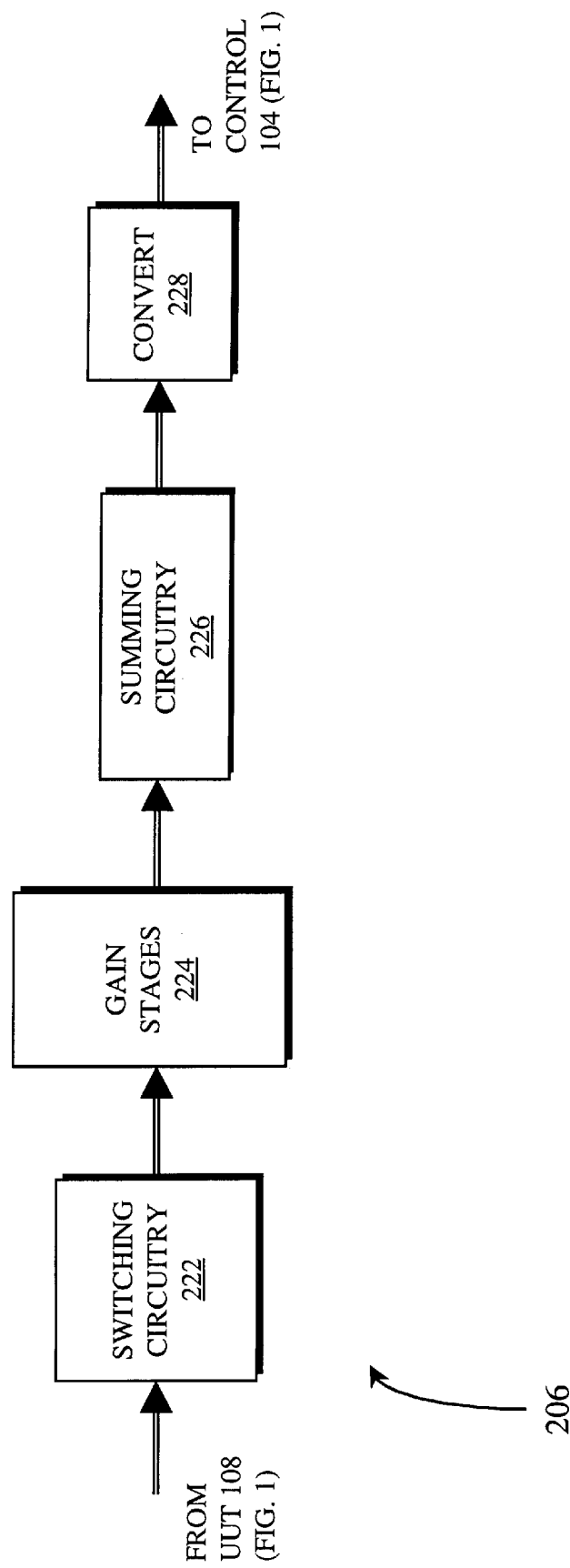
FIG. 2A is a block diagram of a measurement channel in accordance with the present invention.

FIG. 2A shows a high-level block diagram of a source/measurement channel 206 according to the present invention. The channel 206 is an improvement of the source/measurement channel 106 shown in FIG. 1. Accordingly, the channel 206 may be used in place of the channel 106 for performing voltage measurements on the UUT 108 (FIG. 1), which may be a semiconductor device or a printed circuit board assembly.

The channel 206 can be used to perform voltage measurements on a wide range of analog voltage levels. Accordingly, the channel 206 includes a plurality of gain stages 224, in which each gain stage preferably provides output voltages that are proportional to a respective range of input voltage levels.

The gain stages 224 are coupled to switching circuitry 222, which provides the input voltage levels to the gain stages 224. The switching circuitry 222 is coupled to the UUT 108 in a conventional manner. For example, interface hardware (not shown) may be provided between the switching circuitry 222 and the UUT 108. The interface hardware typically includes test pins or probes that connect the switching circuitry 222 to selected nodes or primary outputs of the UUT 108. Accordingly, the switching circuitry 222 directs voltage levels at the selected nodes or primary outputs of the UUT 108 to the gain stages 224.

The gain stages 224 are also coupled to summing circuitry 226, which combines the outputs from the gain stages 224 and provides the combined output to an A-to-D converter 228. The digital output from the A-to-D converter 228 is then provided to the control circuitry 104 for subsequent analysis. The exact implementation of the A-to-D converter 228 is not critical to the invention.

Figure 2B:
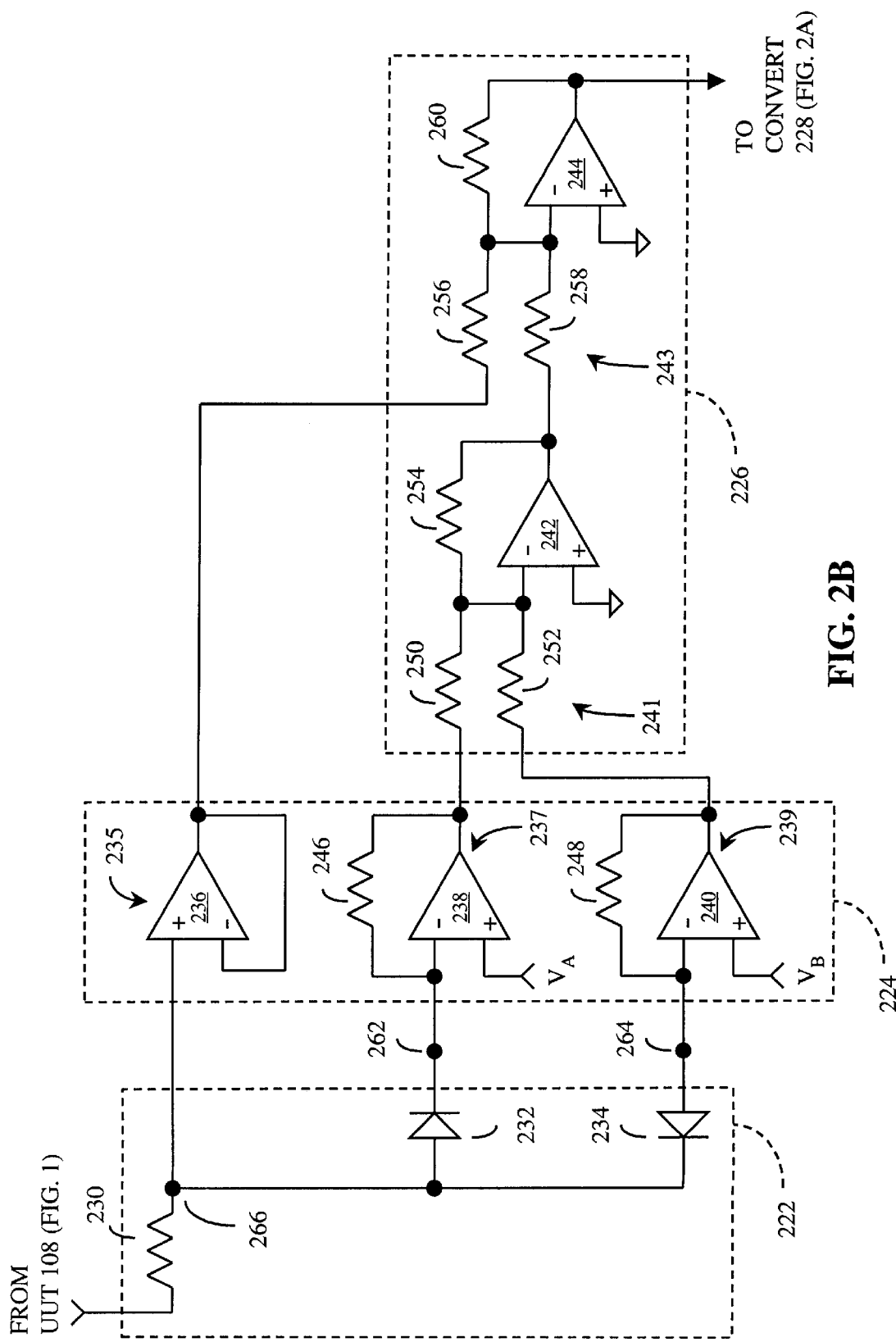
FIG. 2B is a schematic diagram of circuitry included in the measurement channel shown in FIG. 2A.

FIG. 2B shows a detailed schematic diagram of the switching circuitry 222, the gain stages 224, and the summing circuitry 226 included in channel 206. In the preferred embodiment, the switching circuitry 222 includes an input resistor 230 and a plurality of diodes, such as diodes 232 and 234. The resistor 230 is connected to the diodes 232 and 234 at a node 266.

Accordingly, the resistor 230 limits the current flow through the diodes 232 and 234, thereby ensuring that the diodes 232 and 234 are not destroyed by excessive current levels during operation of the channel 206. The resistor 230 also prevents any high voltages produced by the UUT 108 from being directly applied to the diodes 232 and 234 or any active elements (e.g., an operational amplifier 236) in the channel 206, thereby ensuring that the diodes 232 and 234 and the active elements are not destroyed by excessive voltage levels. This is particularly important when the diodes 232 and 234 and the active elements are implemented using integrated circuit design techniques.

The node 266 is connected directly to the input of a non-inverting unity-gain amplifier 235, which is included in the gain stages 224. The unity-gain amplifier 235 includes the operational amplifier 236. In the preferred embodiment, the gain stages 224 also include a plurality of current-to-voltage converters, such as the current-to-voltage converters 237 and 239. The current-to-voltage converter 237 includes an operational amplifier 238 and a feedback resistor 246. Similarly, the current-to-voltage converter 239 includes an operational amplifier 240 and a feedback resistor 248. Further, the non-inverting inputs of the operational amplifiers 238 and 240 are connected to bias voltages $V_A$ and $V_B$, respectively.

The outputs of the current-to-voltage converters 237 and 239 are connected to the inputs of a summing amplifier 241, which is included in the summing circuitry 226. In the preferred embodiment, the summing circuitry 226 includes a plurality of summing amplifiers, such as the summing amplifiers 241 and 243. The summing amplifier 241 includes an operational amplifier 242, input resistors 250 and 252, and a feedback resistor 254. Similarly, the summing amplifier 243 includes an operational amplifier 244, input resistors 256 and 258, and a feedback resistor 260. Further, the output of the unity-gain amplifier 235 and the output of the summing amplifier 241 are connected to the inputs of the summing amplifier 243, which provides voltage measurements to the A-to-D converter 228.

As mentioned above, the channel 206 can perform voltage measurements on a range of voltage levels. Accordingly, the unity-gain amplifier 235 and the current-to-voltage converters 237 and 239 preferably measure voltages corresponding to respective voltage ranges. In particular, the unity-gain amplifier 235 preferably measures voltages corresponding to a middle voltage range, and the current-to-voltage converters 237 and 239 preferably measure voltages corresponding to upper and lower voltage ranges, respectively. The lower, middle, and upper voltage ranges are meant to cover a continuous range of voltage measurements.

The diode 232 is connected to a node 262, which is coupled to the inverting input of the operational amplifier 238. Similarly, the diode 234 is connected to a node 264, which is coupled to the inverting input of the operational amplifier 240.

Whereas the diode 232 is connected between the nodes 266 and 262 such that the forward voltage drop across the diode 232 is from node 266 to node 262, the diode 234 is connected between the nodes 266 and 264 such that the forward voltage drop across the diode 234 is from node 264 to node 266. In this configuration, the diodes 232 and 234 can operate as switches for selectively connecting the current-to-voltage converters 237 and 239 to the node 266.

In particular, the current-to-voltage converter 237 can be viewed as being connected to the node 266 when the junction of the diode 232 is forward biased. Further, the current-to-voltage converter 237 can be viewed as being effectively isolated or disconnected from the node 266 when the junction of the diode 232 is reverse biased.

Similarly, the current-to-voltage converter 239 can be viewed as being connected to the node 266 when the junction of the diode 234 is forward biased. Further, the current-to-voltage converter 239 can be viewed as being effectively isolated or disconnected from the node 266 when the junction of the diode 234 is reverse biased.

In particular, the junction of the diode 232 is forward biased when the voltage level at the node 266 is greater than the level at the node 262 by at least the threshold voltage, $V_T$, of the diode 232, which is typically 0.8 V. Similarly, the junction of the diode 234 is forward biased when the voltage level at the node 264 is greater than the level at the node 266 by at least the threshold voltage, $V_T$, of the diode 234, which is also typically 0.8 V.

As mentioned above, the non-inverting inputs of the operational amplifiers 238 and 240 are connected to bias voltages $V_A$ and $V_B$, respectively. Invoking to the infinite-gain approximation, this means that the levels at the nodes 262 and 264 are $V_A$ and $V_B$, respectively.

Accordingly, the current-to-voltage converter 237 can be viewed as being connected to the node 266 when the voltage level at the node 266 is greater than or equal to $(V_A+V_T)$. Similarly, the current-to-voltage converter 239 can be viewed as being connected to the node 266 when the voltage level at the node 266 is less than or equal to $(V_B-V_T)$.

An important feature of the invention is that the bias voltages $V_A$ and $V_B$ can be selected to define boundaries of the upper and lower voltage ranges measured by the current-to-voltage converters 237 and 239, respectively. For example, in the preferred embodiment, the bias voltage $V_A$ is greater than the bias voltage $V_B$. Consequently, the upper voltage range is preferably defined as including levels greater than or equal to $(V_A+V_T)$. Further, the lower voltage range is preferably defined as including levels less than or equal to $(V_B-V_T)$. This means that the middle voltage range, which is measured by the unity-gain amplifier 235, includes those levels between $(V_A+V_T)$ and $(V_B-V_T)$.

As mentioned above, the gain stages 224 preferably include the unity-gain amplifier 235 and the current-to-voltage converters 237 and 239. As is known to those skilled in this art, the unity-gain amplifier 235 produces a voltage level that is proportional to an input voltage level. Further, the current-to-voltage converters 237 and 239 produce voltage levels that are proportional to input current levels.

The current-to-voltage converters 237 and 239 are therefore amplifiers for the currents through the forward biased diodes 232 and 234. This means that the channel 206 performs voltage measurements for the middle voltage range by directly measuring the level at the node 266. Further, the channel 206 performs voltage measurements for the upper and lower voltage ranges indirectly by measuring the currents through the diodes 232 and 234.

For example, if a voltage level at a selected node of the UUT 108 falls within the middle voltage range (i.e., the voltage level is between $(V_A+V_T)$ and $(V_B-V_T)$), then the voltage level is applied to the unity-gain amplifier 235. Further, the voltage level causes the diodes 232 and 234 to be reverse biased. This means that essentially no current flows through the diodes 232 and 234.

The output of the unity-gain amplifier 235 is therefore proportional and preferably equal to the voltage level at the selected node. Further, the outputs of the current-to-voltage converters 237 and 239 are constant. In particular, the output of the current-to-voltage converter 237 is equal to $V_A$ and the output of the current-to-voltage converter 239 is equal to $V_B$.

Consequently, the output of the summing amplifier 241 is proportional to the sum of $V_A$ and $V_B$. Further, the output of the summing amplifier 243 is proportional to the sum of $V_A$, $V_B$, and the output of the unity-gain amplifier 235. Any changes in the voltage level at the selected node between the levels $(V_A+V_T)$ and $(V_B-V_T)$ are therefore measured by the unity-gain amplifier 235 and reflected at the output of the summing amplifier 243.

If the voltage level at the selected node instead falls within the upper voltage range (i.e., the voltage level is greater than or equal to $(V_A+V_T)$), then the diode 232 becomes forward biased and the diode 234 remains reverse biased. Consequently, current flows through the diode 232 from the node 266 to the node 262. The amount of current flowing through the diode 232 is proportional to the voltage at the selected node. Further, essentially no current flows through the diode 234.

The output of the current-to-voltage converter 237 is therefore proportional to the voltage level at the selected node. In particular, the output of the current-to-voltage converter 237 is equal to $$V_{O,\,237}=V_A-R_{246}I, \qquad (eq.\ 1)$$

where $R_{246}$ is the value of the feedback resistor 246 and I is the value of the current through the diode 232. Accordingly, the output of the current-to-voltage converter 237 is linearly related to the current through the diode 232.

Further, the outputs of the unity-gain amplifier 235 and the current-to-voltage converter 239 are constant. In particular, the output of the current-to-voltage converter 239 is equal to $V_B$ and the output of the unity-gain amplifier 235 is approximately $(V_A+V_T)$. This is because the voltage at the node 266 remains at approximately $(V_A+V_T)$ while the diode 232 is forward biased.

Consequently, the output of the summing amplifier 241 is proportional to the sum of $V_B$ and the output of the current-to-voltage converter 237. Further, the output of the summing amplifier 243 is proportional to the sum of $V_B$, $(V_A+V_T)$, and the output of the current-to-voltage converter 237. Any changes in the voltage level at the selected node above the level $(V_A+V_T)$ are therefore measured by the current-to-voltage converter 237 and reflected at the output of the summing amplifier 243.

If the voltage level at the selected node instead falls within the lower voltage range (i.e., the voltage level is less than or equal to $(V_B-V_T)$), then the diode 234 becomes forward biased and the diode 232 remains reverse biased. Consequently, current flows through the diode 234 from the node 264 to the node 266. The amount of current flowing through the diode 234 is proportional to the voltage at the selected node. Further, essentially no current flows through the diode 232.

The output of the current-to-voltage converter 239 is therefore proportional to the voltage level at the selected node. In particular, the output of the current-to-voltage converter 239 is equal to $$V_{O,\,239}=V_B-R_{248}I, \qquad (eq.\ 2)$$

where $R_{248}$ is the value of the feedback resistor 248 and I is the value of the current through the diode 234. Accordingly, the output of the current-to-voltage converter 239 is linearly related to the current through the diode 234.

Further, the outputs of the unity-gain amplifier 235 and the current-to-voltage converter 237 are constant. In particular, the output of the current-to-voltage converter 237 is equal to $V_A$ and the output of the unity-gain amplifier 235 is approximately $(V_B-V_T)$. This is because the voltage at the node 266 remains at approximately $(V_B-V_T)$ while the diode 232 is forward biased.

Consequently, the output of the summing amplifier 241 is proportional to the sum of $V_A$ and the output of the current-to-voltage converter 239. Further, the output of the summing amplifier 243 is proportional to the sum of $V_A$, $(V_B-V_T)$, and the output of the current-to-voltage converter 239. Any changes in the voltage level at the selected node below the level $(V_B-V_T)$ are therefore measured by the current-to-voltage converter 239 and reflected at the output of the summing amplifier 243.

The gains of the current-to-voltage converters 237 and 239 and the summing amplifiers 241 and 243 are preferably selected to provide an output voltage at the summing amplifier 243 that is proportional to the input voltage at the resistor 230 throughout the entire measured voltage range. Further, it should be noted that the measured voltage range could be easily varied by simply selecting different values for the resistor 260, thereby changing the closed-loop gain of the summing amplifier 243.

In practical channel implementations, the current, I, in eq. 1 and eq. 2 is the sum of the current through the respective diode 232 or 234 and the bias current of the respective operational amplifier 238 or 240. For this reason, in the preferred embodiment, the operational amplifiers 238 and 240 have FET inputs. The bias currents of the operational amplifiers 238 and 240 are therefore very small and can be ignored in most cases.

Further, it was mentioned above that essentially no current flows through the diodes 232 and 234 when they are reverse biased. However, in practical channel implementations, a small leakage current may flow through the reverse biased diodes. For this reason, the diodes 232 and 234 are preferably of the same type and therefore produce the same levels of leakage current. Consequently, any leakage currents through the diodes 232 and 234 cause the outputs of the current-to-voltage converters 237 and 239 to change by proportional amounts. This means that the leakage currents through the reverse biased diodes 232 and 234 can also be ignored in most cases.

Still further, it was mentioned above that the voltage at the node 266 remains at approximately $(V_A+V_T)$ while the diode 232 is forward biased, and that the voltage at the node 266 remains at approximately $(V_B-V_T)$ while the diode 232 is forward biased. However, in practical channel implementations, the voltage levels at the node 266 may vary within a range of about two (2) volts as the current through the forward biased diodes increases. Because the diodes 232 and 234 are preferably of the same type, any voltage variations at the node 266 when the diodes 232 and 234 are forward biased are again proportional. This means that forward voltage variations across the diodes 232 and 234 can also be ignored in most cases.

In a typical tester configuration, the input resistor 230 may have a value of 100 kΩ; the feedback resistors 246 and 248 may have values of 10 kΩ; the input resistors 250 and 252 may have values of 20 kΩ; the feedback resistor 254 may have a value of 10 kΩ; the input resistors 256 and 258 may have values of 100 kΩ and 5 kΩ, respectively; and, the feedback resistor 260 may have a value of 5 kΩ. Further, the diodes 232 and 234 may be type D1N914 (it should be noted that virtually any type of diode may be used); and, the operational amplifiers 236, 238, 240, and 242 may be type LF412. Finally, the operational amplifier may be type LT1361.

It follows from the above description that the present invention offers important advantages over conventional channel circuitry used to perform voltage measurements on semiconductor devices and printed circuit board assemblies.

First, the present invention does not use discrete relays for selecting between a plurality of voltage ranges. The invention instead uses a plurality of diodes and a plurality of current-to-voltage converters, which measure current flowing through the diodes when they are forward biased. Test conditions that cause the diodes to become forward biased can be specified by the relative configuration of the diodes and the bias voltages applied to the current-to-voltage converters. Diodes are generally less costly, more reliable, and smaller than discrete relays.

Further, even though the diodes are inherently non-linear, the current-to-voltage converters provide output voltages that are linearly related to respective input currents. The non-linear diodes 232 and 234 used in the switching circuitry 222 therefore have a minimal effect on the accuracy of the output voltage provided by the summing circuitry 226.

In addition, the present invention provides a high impedance interface between the measurement circuitry and an electronic unit under test. For example, when the output of the unity-gain amplifier 235 is proportional to a middle range of voltage measurements, the input impedance of the channel 206 is approximately equal to the input impedance of the operational amplifier 236. Because the operational amplifier 236 preferably has FET inputs, the input impedance for this case is on the order of 10 GΩ.

Further, when the outputs of the current-to-voltage converters 237 and 239 are proportional to an upper and a lower range of voltage measurements, respectively, the input impedance of the channel 206 is approximately equal to the value of the input resistor 230. As mentioned above, the value of the resistor 230 is typically 100 kΩ. Alternate values may also be chosen depending upon the loading and bandwidth requirements of the measurement system.

Also, the diodes 232 and 234, and the operational amplifiers 236, 238, 240, 242, and 244 can be easily implemented on a monolithic substrate. Depending upon the values chosen for the resistors 246, 248, 250, 252, 254, 256, 258, and 260, some of these might also be implemented on the same substrate. Consequently, a very small amount of space is generally required to implement the voltage measurement circuitry shown in FIG. 2B. This is important because a typical tester might include over one hundred (100) channels. By making the channel circuitry compact, more of this channel circuitry can be placed closer to the unit under test.

Having described one embodiment, numerous alternative embodiments or variations might be made. For example, the present invention was described relative to specific tester architecture. However, this was merely an illustration. The invention may be used in conjunction with any tester architecture.

It was also described that the invention is used with highly automated test equipment. However, this was also merely an illustration. The invention might alternatively be used with less automated testers. The invention might even be incorporated into instruments designed for bench-top use.

It was also described that the invention may be used to perform voltage measurements on three ranges of voltage levels. However, this was merely an illustration. The embodiment shown in FIG. 2B may be modified to cover more or fewer voltage ranges, depending upon the requirements of the measurement system.

Therefore, the invention should be limited only by the spirit and scope of the appended claims.

What is claimed is:

1. A tester including scaling circuitry for performing voltage measurements on a unit under test, the scaling circuitry comprising:

a measurement input coupled to the unit under test and receiving an input signal to be measured;

a plurality of gain stages having respective inputs coupled to the measurement input and respective outputs generating respective output signals; and a summing circuit having a plurality of inputs coupled to the respective outputs of the plurality of gain stages and generating an output signal that varies in relation with a sum of the output signals of the plurality of gain stages, wherein at least one of the gain stages is coupled to the input via a diode, said at least one of the gain stages generating a substantially constant output responsive to a reverse-biased condition of the respective diode, and a variable output responsive to a forward-biased condition of the respective diode, said variable output varying in relation with the input signal to be measured.

2. The tester as recited in claim 1, wherein one of the plurality of gain stages is a unity-gain amplifier.

3. The tester as recited in claim 1, wherein the at least one of the gain stages includes at least one current-to-voltage converter.

4. The tester as recited in claim 3, wherein the at least one current-to-voltage converter includes an operational amplifier with FET inputs.

5. The tester as recited in claim 3, wherein the at least one current-to-voltage converter receives a bias voltage that defines a transition point between voltage ranges of the voltage measurement circuitry.

6. The tester as recited in claim 1, further including a plurality of channels connected to the unit under test, the voltage measurement circuitry being incorporated into at least one of the channels.

7. The tester as recited in claim 1, used in a method for manufacturing the unit under test, the method comprising the steps of:

(a) attaching the unit under test to a test fixture;

(b) applying power and test signals to the unit under test;

(c) measuring voltage levels on the unit under test; and (d) comparing the measured voltage levels with expected values, thereby determining whether the unit under test is defective.

8. A circuit for scaling an input signal for measurement in an automatic test system, comprising:

a measurement input coupled to a unit under test and receiving an input signal to be measured;

a gain circuit having an input coupled to the measurement input and having an output generating an output signal;

at least one gain stage hang an input coupled to the measurement input via an impedance and generating a respective output; and a summing circuit having a plurality of inputs respectively coupled to the output of the gain circuit and the output of each at least one gain stage, wherein the output signal of each at least one gain stage varies with the input signal responsive to the measurement input exceeding a respective predetermined threshold in a predetermined direction, and remains substantially constant responsive to the measurement input not exceeding the respective predetermined threshold in the predetermined direction.

9. A circuit as recited in claim 8, wherein the at least one gain stage comprises:

a first switchable gain stage that generates a variable output signal in response to the measurement input exceeding a first predetermined threshold in a positive direction; and a second switchable gain stage that generates a variable output signal in response to the measurement input exceeding a second predetermined threshold in a negative direction.

10. A circuit as recited in claim 9, wherein the first predetermined threshold is more positive than the second predetermined threshold.

11. A circuit as recited in claim 9, wherein the first and second gain stages each comprise a current-to-voltage converter.

12. A circuit as recited in claim 11, wherein the first and second gain stages each further comprise a diode coupled between the measurement input and the respective current-to-voltage converter.

* * * * *